US007027605B2

(12) United States Patent
Werner

(10) Patent No.: US 7,027,605 B2
(45) Date of Patent: Apr. 11, 2006

(54) MID-RANGE LOUDSPEAKER

(75) Inventor: Bernard M. Werner, Los Angeles, CA (US)

(73) Assignee: Harman International Industries, Incorporated, Northridge, CA (US)

(*) Notice: Subject to any disclaimer, the term of this patent is extended or adjusted under 35 U.S.C. 154(b) by 0 days.

(21) Appl. No.: 10/435,988

(22) Filed: May 12, 2003

(65) Prior Publication Data

US 2003/0194098 A1 Oct. 16, 2003

Related U.S. Application Data

(63) Continuation of application No. 09/644,611, filed on Aug. 23, 2000, now abandoned.

(60) Provisional application No. 60/160,705, filed on Oct. 20, 1999.

(51) Int. Cl.
*H03G 5/00* (2006.01)
*H04R 25/00* (2006.01)
*H04R 1/02* (2006.01)
*H05K 5/00* (2006.01)
*G10K 11/00* (2006.01)

(52) U.S. Cl. .......................... 381/99; 381/98; 381/150; 381/338; 381/340; 181/152; 181/177

(58) Field of Classification Search .................. 381/98, 381/99, 338, 150, 97, 111, 340; 181/152
See application file for complete search history.

(56) References Cited

U.S. PATENT DOCUMENTS

| | | | | |
|---|---|---|---|---|
| 4,243,840 | A * | 1/1981 | Kates | 381/99 |
| 5,109,423 | A * | 4/1992 | Jacobson et al. | 381/336 |
| 5,420,929 | A * | 5/1995 | Geddes et al. | 381/1 |
| 5,821,470 | A * | 10/1998 | Meyer et al. | 181/155 |
| 5,930,374 | A * | 7/1999 | Werrbach et al. | 381/99 |
| 6,009,182 | A * | 12/1999 | Gunness | 381/182 |
| 6,394,223 | B1 * | 5/2002 | Lehman | 181/152 |
| 6,411,718 | B1 * | 6/2002 | Danley et al. | 381/342 |
| 6,466,680 | B1 * | 10/2002 | Gelow et al. | 381/340 |
| 6,513,622 | B1 * | 2/2003 | Gelow et al. | 181/152 |

* cited by examiner

*Primary Examiner*—Laura A. Grier
(74) *Attorney, Agent, or Firm*—The Eclipse Group

(57) ABSTRACT

A midrange loudspeaker for operation in conjunction with low-frequency and high-frequency loudspeaker modules in a theater sound system, having a reduced depth for deployment in limited space. The midrange module is configured with a plurality of drivers and a waveguide unit that provides uniform sound coverage throughout a theater auditorium with substantially seamless crossovers at 250 Hz and 1.5 kHz and with the vertical beam-width held substantially constant by an electrical filter network.

20 Claims, 8 Drawing Sheets

MID-RANGE LOUDSPEAKER

CROSS REFERENCE TO RELATED APPLICATIONS

This application is a continuation of U.S. patent application Ser. No. 09/644,611, filed on Aug. 23, 2000, now abandoned, titled IMPROVED MIDRANGE LOUDSPEAKER MODULE FOR CINEMA SCREEN, which claims the benefit of U.S. Provisional Application Ser. No. 60/160,705, filed on Oct. 20$^{th}$, 1999, both of which are incorporated by reference into this application.

BACKGROUND OF THE INVENTION

1. Field of the Invention

The present invention relates to cinema sound systems and more particularly to mid-frequency range loudspeaker systems.

2. Related Art

When designing a cinema or theater loudspeaker system, it is desirable to provide uniform or consistent loudness and full mid-frequency range sound coverage to the seating locations in the cinema. Further, the perceived sound source needs to sufficiently coincide with the images projected on the screen, while operating with an efficiency that keeps the total audio amplifier power requirements within practical limits.

One design approach for cinema loudspeakers is the use of conventional horns or waveguides and drivers. One drawback with the use of conventional horns or waveguides is that frequency pattern control of conventional horns or waveguides require a relatively large mouth and overall size to provide the required directivity. For example horns of conventional designs are required to be about four to five feet in depth to achieve the required pattern control at frequencies in the order of 250 Hz. Conventional horns designs are therefore generally undesirable because they occupy a large area behind the cinema screen, decreasing the amount of usable cinema space.

Another design approach for providing cinema sound is with array loudspeakers. An array of loudspeakers may have multiple speakers with selective frequency response ranges similar to a home speaker unit with a high, mid, and low-range speaker. However, the unusual degree of beam width confinement and control required for successful implementation of an array of loudspeakers to function as a unified signal source presents additional design challenges. Furthermore, array loudspeakers are unable to compensate for phases between the different loudspeaker signals and are unable to control the vertical off-axis angle at which the summation between the signals is greatest.

Thus, a need exists for a loudspeaker system that is smaller than a conventional horn design yet provides the frequency pattern control of the horn design and the selective frequency responses of array loudspeakers to satisfy the size, coverage and power requirements of a cinema or theater.

SUMMARY

The loudspeaker system of the invention is a mid-range array loudspeaker for use in cinema or theater loudspeaker array systems. The mid-range array loudspeaker is designed as an acoustic waveguide loaded array of loudspeaker drive units that provides uniform loudness and full mid-frequency range sound coverage to the listening regions of the cinema or theater.

The mid-range array loudspeaker is comprised of multiple drivers positioned in a waveguide unit. By using multiple drivers, the size of the drivers may be smaller than those found in conventional mid-range array loudspeakers, thereby reducing power requirements, heat generation and the overall size of the loudspeaker. Further, the mid-frequency array loudspeaker of the invention not only has a shallow profile, not exceeding 18 inches in depth, but also provides substantially constant beam width down to a designated frequency, such as 250 Hz.

Other systems, methods, features and advantages of the invention will be or will become apparent to one with skill in the art upon examination of the following figures and detailed description. It is intended that all such additional systems, methods, features and advantages be included within this description, be within the scope of the invention, and be protected by the accompanying claims.

BRIEF DESCRIPTION OF THE DRAWINGS

The invention can be better understood with reference to the following figures. The components in the figures are not necessarily to scale, emphasis instead being placed upon illustrating the principles of the invention. In the figures, like reference numerals designate corresponding parts throughout the different views.

DETAILED DESCRIPTION

Figure 1:
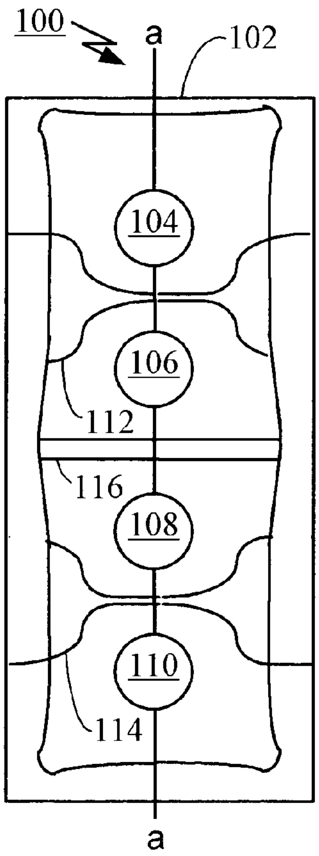
FIG. 1 is a front view of the mid-range array loudspeaker of the invention.

FIG. 1 is front view of an example implementation of a mid-range array loudspeaker 100 of the invention. The mid-range array loudspeaker 100 illustrated in FIG. 1 is designed for use in cinema and theater loudspeaker array systems; however, the mid-range array loudspeaker may also be utilized for other applications.

As illustrated in FIG. 1, the mid-range array loudspeaker 100 is an acoustic waveguide unit 102 having foul transducer drivers 104, 106, 108 and 110. The four transducer drivers 104, 106, 108 and 110, commonly referred to as drivers, are typically round units ranging from approximately 6.5 to 12 inches in diameter and are mounted on the rear of the acoustic waveguide unit 102. The cone of each driver 104, 106, 108 and 110 provides a separate waveguide for each driver 104, 106, 108 and 110. The cones of each driver are then integrated into common waveguides 112, 114 and 116. The waveguides 112, 114 and 116 together form part of the overall waveguide unit 102, which functions to uniformly radiate the energy of the acoustical sources with the plurality of drivers 104, 106, 108 and 110 and generate a frequency response from approximately 250 Hz to approximately 1.5 kHz.

Figure 2:
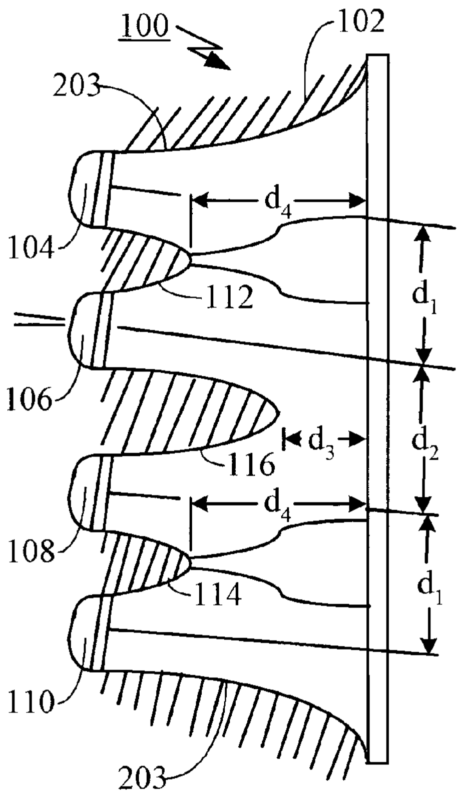
FIG. 2 is a cross-sectional side view of a four-element vertical stack mid-range array loudspeaker taken along line a—a of FIG. 1.

FIG. 2 is a cross-sectional side view of the mid-range array loudspeaker taken along line a—a of FIG. 1. FIG. 2 illustrates the integration of the cones and drivers into the waveguide unit 102. For the upper and lower drivers 104 and 110, respectively, the exterior walls 203 of waveguide unit 102 form the exterior surfaces of the waveguide for drivers 104 and 110, respectively. Vanes 112 and 114 are defined by a rounded nose shape and form the opposing walls of the waveguide unit 102 for the drivers 104 and 110, respectively. Drivers 106 and 108 are separated from one another by a central vane 116 that is also defined by a rounded nose shape. As seen in FIG. 2, the central vane 116 is slightly larger than the vanes 112 and 114. Vanes 112 and 114 form the waveguide walls opposing the central vane 116 for the waveguide drivers 106 and 108, respectively, and the walls opposing the exterior walls 203 for waveguide drivers 104 and 110, respectively.

Each driver is mounted to the backside of the waveguide unit 102 of the array loudspeaker 100. As illustrated by FIG. 2, the mounting surfaces for the drivers 104, 106, 108 and 110 are not perpendicular to the face of the waveguide unit 102, but are tilted from vertical to optimize the defined coverage. The mounting surfaces are titled such that each driver has a design axis angle that is aimed downward from the nominal on-axis angle by approximately 5 degrees. In other embodiments, the nominal on axis angle may be greater or less than five degrees. In yet other embodiments, the nominal on axis angle may be zero degrees.

When using 6.5 inch drivers, the center-to-center spacing dimension "$d_1$" for the upper and lower driver pairs 104, 106 and 108, 110 is approximately 7.75 inches, and the spacing dimensions "$d_2$" for drivers 106 and 108 is approximately 11.25 inches. Dimension "$d_3$", the setback of vane 116 from the front plane, is approximately 3 inches, and dimension "$d_4$", which is the setback of vanes 112 and 114 from the front plane, is approximately 6.5 inches.

Figure 3:
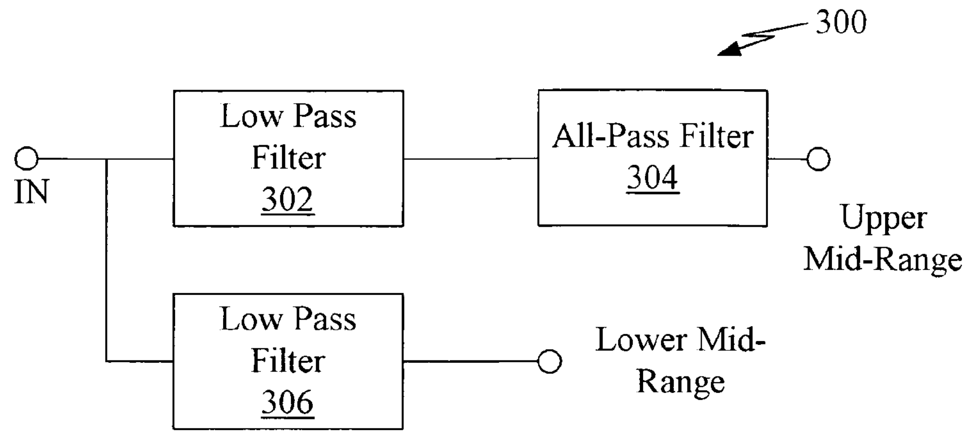
FIG. 3 is a block diagram of a filtering network for the driver of the mid-range array loudspeaker of FIG. 1.

FIG. 3 illustrates a block diagram of a filtering network for the drivers of the mid-range array loudspeaker 100 shown in FIG. 1. The low pass filters 302 and 306 receive an electrical signal from the input "IN". After the electrical signal has been transferred through a common electrical node to the plurality of low pass filters, the electrical signals are filtered by the low pass filters into filtered electrical signals. Thus, the one electrical signal is routed among the multiple paths created by the low pass filters 302 and 306. The electrical signal through the lowest frequency path is commonly referred to as the lower mid-range signal and is passed directly to an associated output. The output is in communication with the lowest mid-range driver.

The other path passes the filtered electrical signal from the low pass filter 302 through an all-pass filter 304 to an upper mid-range output. Tile all-pass filter 304 functions as a frequency dependent phase delay device that introduces a frequency dependent phase delay between the low pass filter 302 and the upper mid-range output that compensates for the different phases between different loudspeakers (drivers, horns, and waveguides). The upper mid-range outputs are each similarly connected to an associated upper mid-range driver.

The network of low pass filters and all-pass filters may be increased in number with in multiple upper mid-range outputs. However, the lowest mid-range output passes only through an associated low pass filter 306. Further, amplifiers (not shown) may be placed in the electrical signal path prior to the electrical signals being, sent to the different drivers. The filtering network may be implemented with either analog or digital circuitry, and may be inserted either before or after the power amplifiers that provide the electrical signals to the midrange drivers.

Although FIG. 3 represents block 304 as all-pass filter, in an alternate embodiment, the frequency dependent phase delay device that introduces a frequency dependant phase delay may be a delay line. In yet another embodiment, all-pass filters and delay lines may be used to introduce the frequency dependent phase delay. Thus, the electrical input signal that results in the upper mid-range signal would pass through a low pass filter 302 and a delay line or delay line and all-pass filter. The delay line could be digital or analog and optionally implemented at a low signal level followed by power amplification. Further, the frequency dependent phase delay may be introduced by a combination of all-pass filters and delay lines within the same array loudspeaker. An alternate implementation may also be accomplished totally or in part by a delay caused by the physical location of the appropriate transducer driver element with regard to setback from the front plane of enclosure and the other elements.

Figure 4:
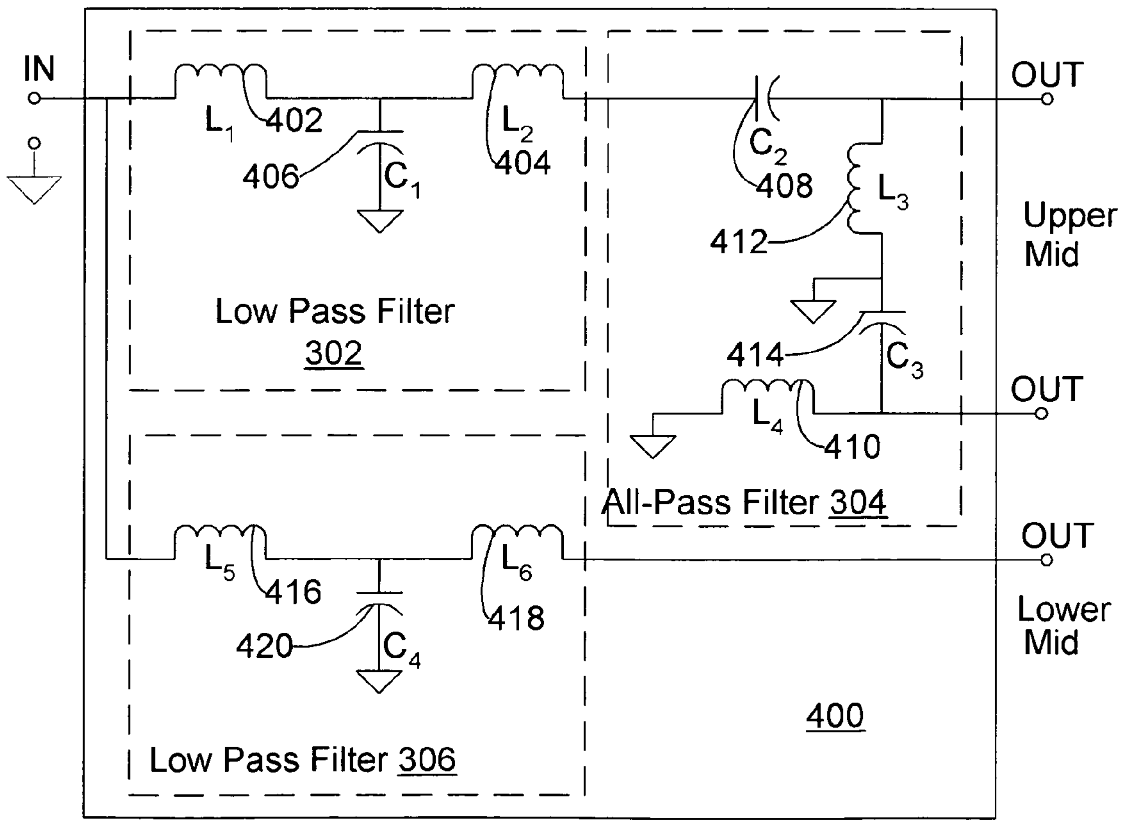
FIG. 4 is an electrical diagram of a passive circuit implementation of the filtering network of FIG. 3.

Turning now to FIG. 4, FIG. 4 is an electrical diagram 400 of a passive circuit implementation of the filtering network shown in FIG. 3. An input "IN" is connected to an inductor $L_1$ 402 that is connected to another inductor $L_2$ 404 and a capacitor $C_1$ 406. The two inductors $L_1$ 402, $L_2$ 404 and capacitor $C_1$ 406 are configured to function as a low pass filter (represent by block 302 in FIG. 3). The output terminal of inductor $L_2$ 404 is connected to a capacitor $C_2$ 408, which is connected to one end of an inductor $L_3$ 412 and an output terminal "OUT". The opposing end of the inductor $l_3$ 412 is connected to a ground and to one end of a capacitor $C_3$ 414. The other end of capacitor $C_4$ 414 is connected to another output "OUT" and inductor $L_4$ 410, which is connected to a ground. The configuration of capacitor $C_2$ 408 and $C_3$ 414 along with inductor $L_3$ 412 and $L_4$ 410 is commonly know as an all-pass filter (represented by block 304 in FIG. 3). Another inductor $L_5$ 416 is connected at one end to the input "IN" and inductor $L_1$ 402. The other terminal of inductor $l_5$ 416 is connected to inductor $L_6$ 418 and capacitor $C_4$ 420. The two inductors $L_5$ 416, $L_6$ 418 and capacitor $C_4$ 420 form a second low pass filter (represented by 306 in FIG. 3)

Figure 5:
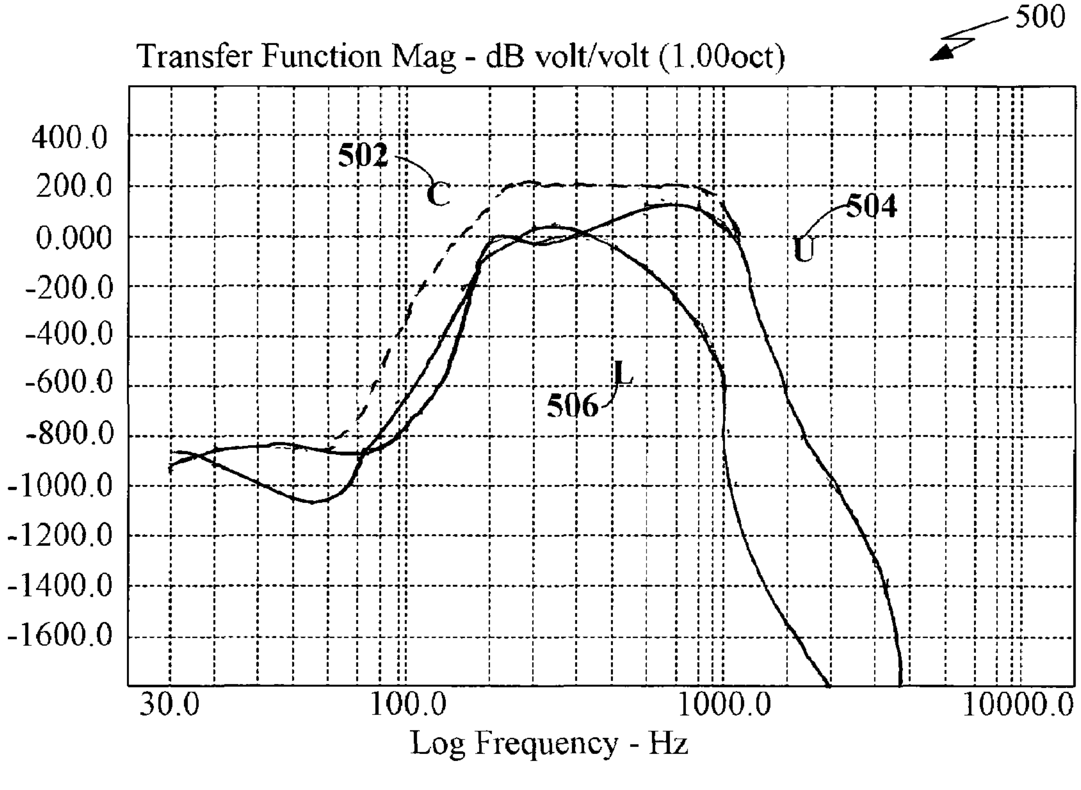
FIG. 5 is an acoustical frequency response transfer function graph of the filtering network of FIG. 4.

FIG. 5 is a frequency response graph 500 showing the resulting acoustic response of the filtering network with an all-pass filter of FIG. 4 when used with the mid-range array loudspeaker 100 of the invention. The graph has three curves "C" 502, "U" 504 and "L" 506 that illustrate the acoustical frequency in dB SPL (Sound Pressure Level). Curve "U" 504 is the transfer curve for the frequency response over from the upper mid-range drivers 104 and 106 while curve "L" 506 is the transfer curve for the frequency response over from the lower mid-range drivers 108 and 110. Curve "U" 504 emphasizes the full mid-range with high frequency outputs, while curve "L" 506 shows the narrower bandwidth due to attenuation at the high frequency end. The combined curve "C", shown as a dashed line, indicates the overall acoustical summation of the frequency response curve "U" 504 and curve "L" 506 for the entire mid-range module extending from about 150 Hz to 1.3 kHz.

Figure 6:
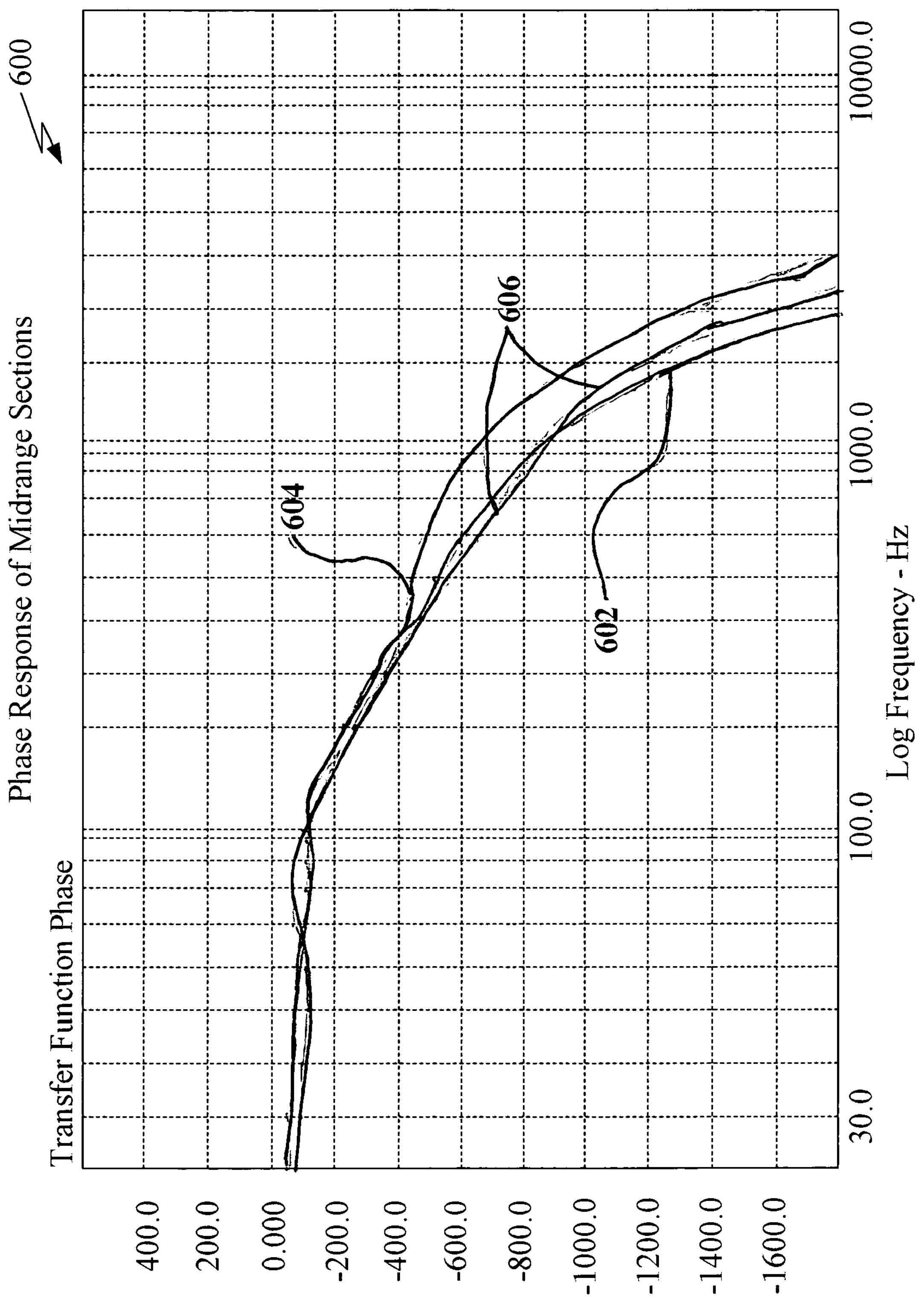
FIG. 6 is a phase transfer function graph of FIG. 5.

FIG. 6 is a phase transfer function graph 600 of FIG. 5. This graph further illustrates the effect that the all-pass filter 304 has on the upper mid-range frequency band. The upper line 602 is an approximate upper mid-range frequency driver acoustic phase response without the all-pass filter 304. Line 604 is the lower midrange frequency driver acoustic phase response. The third line 606 is the upper midrange frequency driver acoustic phase response with an all-pass filter. Together, the three lines 602, 604, and 606 demonstrate that the all-pass filter is compensating for phase but not magnitude, i.e. the phase is independent of magnitude. The upper mid-range frequency acoustic phase with the all-pass filter approaches the ideal case where the phase response of the upper mid-range 606 and lower mid-range frequency 604 driver acoustic phase response are significantly closer. Thus, the maximum summation at the target vertical angle and phase compensation may be achieved.

Figure 7:
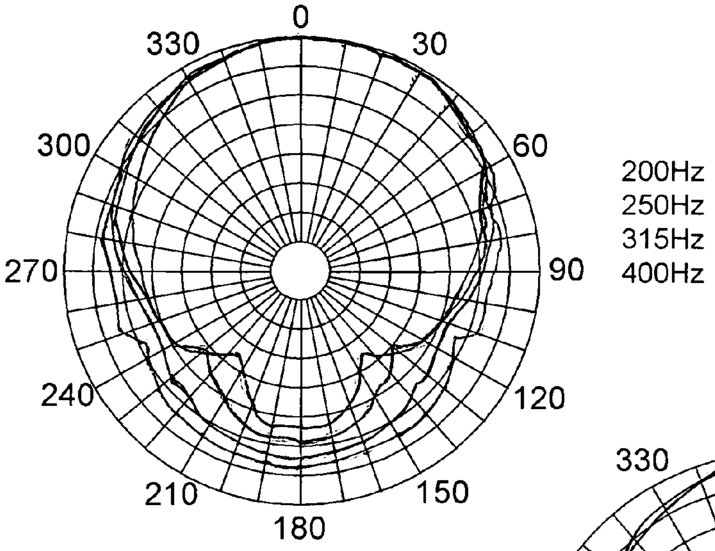
FIG. 7 is a graph showing polar horizontal directivity of a mid-range array loudspeaker of FIG. 1 taken at frequencies ranging from 200 Hz–400 Hz.

FIG. 7 is a graph showing polar horizontal directivity of a mid-range array loudspeaker 100 of FIG. 1 taken at frequencies ranging from 200 Hz–400 Hz. The graph has four plots taken at one-third-octave frequency ranges (200 Hz, 250 Hz, 315 Hz, and 400Hz) with no screen deployed. Each radial step is 6 dB magnitude as indicated, so the −6 dB beam width in degrees of each curve is indicated by the crossings of the −6 dB circle by each curve.

Figure 8:
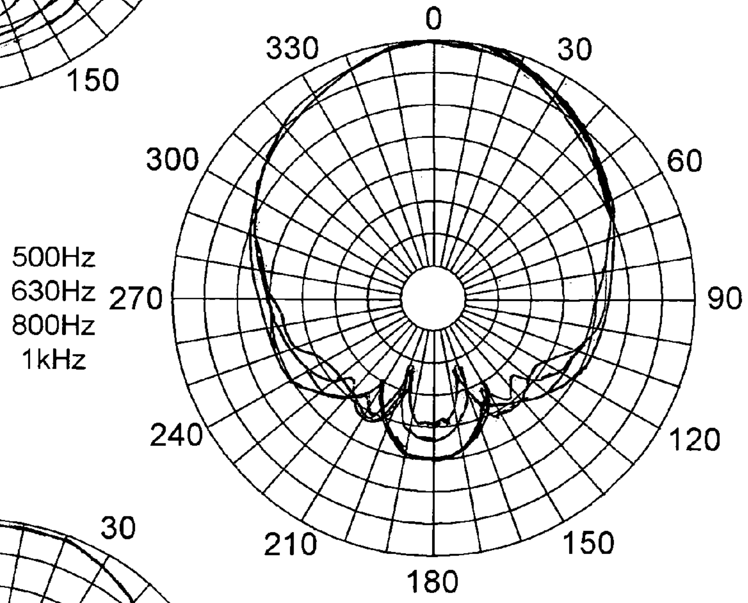
FIG. 8 is a graph showing polar horizontal directivity of a mid-range array loudspeaker of FIG. 1 taken at frequencies ranging from 500 Hz–1 kHz.

FIG. 8 is a graph showing polar horizontal directivity of a mid-range array loudspeaker 100 of FIG. 1 taken at frequencies ranging from 500 Hz–1 kHz. The graph has four plots taken at one-third-octave frequency ranges (500 Hz, 630 Hz, 800 Hz, and 1 kHz) and the 500 Hz being one-third-octave from the 400 Hz of FIG. 7. Each radial step is 6 dB magnitude as indicated, so the −6 dB beam width in degrees of each curve is indicated by the crossings of the −6 dB circle by each curve.

Figure 9:
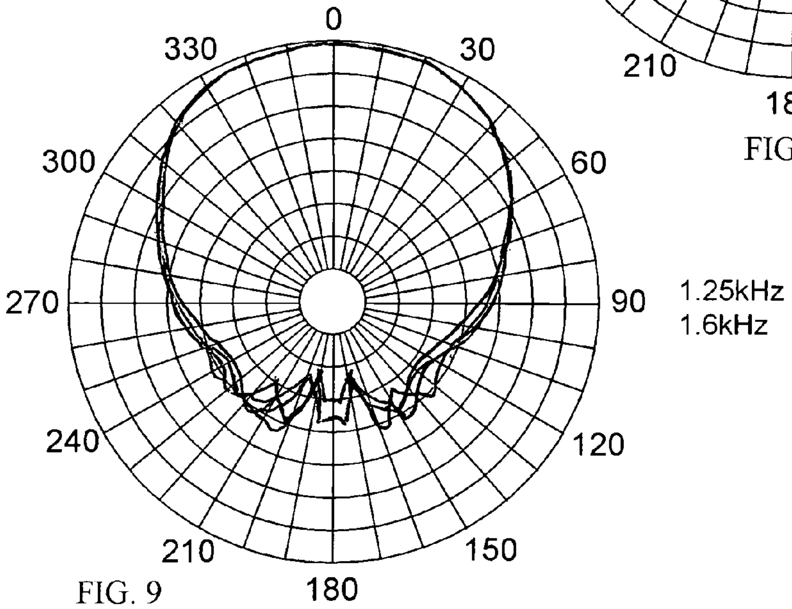
FIG. 9 is a graph showing polar horizontal directivity of a mid-range array loudspeaker or FIG. 1 taken at frequencies ranging from 1.25 kHz–1.6 kHz.

FIG. 9 is a graph showing polar horizontal directivity of a mid-range array loudspeaker 100 of FIG. 1 taken at frequencies ranging, from 1.25 kHz–1.6 kHz. The graph has plots taken at one-third-octave frequency ranges of 1.25 kHz and 1.6 kHz. The 1.25 kHz plot is one-third-octave from 1 kHz of FIG. 8. Each radial step is 6 dB magnitude as indicated so the −6 dB beam width in degrees of each curve is indicated the crossings of the −6 dB circle by each curve.

As illustrated by FIGS. 7–9, the coverage in the horizontal direction is relatively constant. The coverage in the present embodiment is maintained from 200 Hz up to 1.6 kHz in the horizontal direction. Further, the results of the graphs 700, 800 and 900 demonstrate that the coverage of the loudspeaker array has the desirable 90-degree coverage in the horizontal direction.

Figure 10:
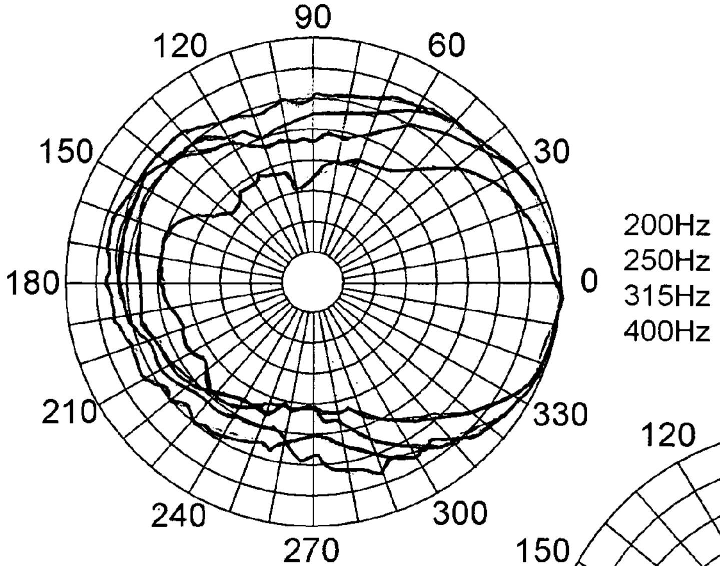
FIG. 10 is a graph showing polar vertical directivity of the mid-range array loudspeaker embodiment of FIG. 1 taken at frequencies ranging from 200 Hz–400 Hz.

FIG. 10 is a graph showing polar vertical directivity of the mid-range array loudspeaker 100 taken at frequencies ranging from 200 Hz–400 Hz. As in FIGS. 7–9, the plots are taken at one-third-octave frequency ranges at 200 Hz, 250 Hz, 315 Hz, and 400 Hz. The five-degree downward aiming of the mid-range loudspeaker drivers 104, 106, 108 and 110 of FIG. 1 is evident.

Figure 11:
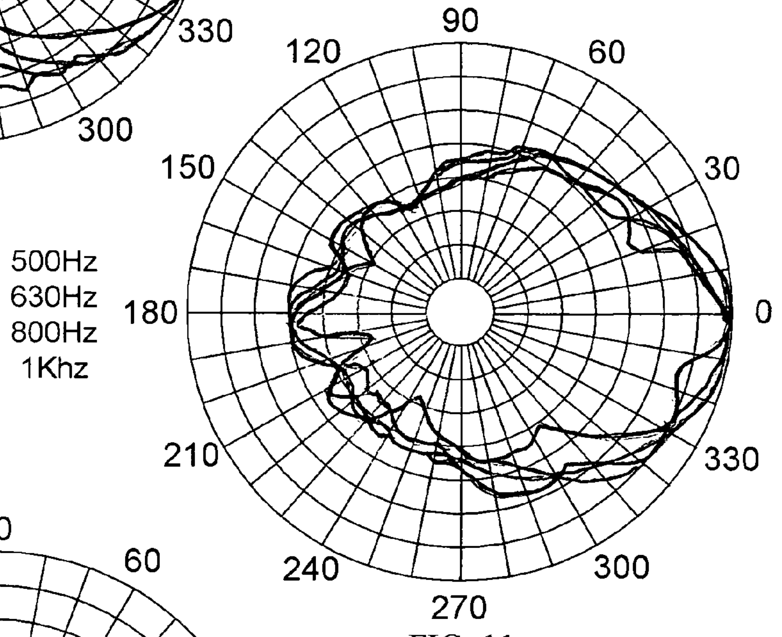
FIG. 11 is a graph showing polar vertical directivity of the mid-range array loudspeaker embodiment of FIG. 1 taken at frequencies ranging from 500 Hz–1 kHz.

FIG. 11 is a graph showing polar vertical directivity of the mid-range array loudspeaker 100 of FIG. 1 taken at frequencies ranging from 500 Hz–1 kHz. The plots are taken at one-third-octave frequency ranges at 500 Hz, 630 Hz, 800 Hz, and 1 kHz. With the 500 Hz plot being a one-third-octave higher that the 400 Hz plot of FIG. 10. The five-degree downward aiming of the mid-range loudspeaker drivers 104, 106, 108 and 110 of FIG. 1 is still evident.

Figure 12:
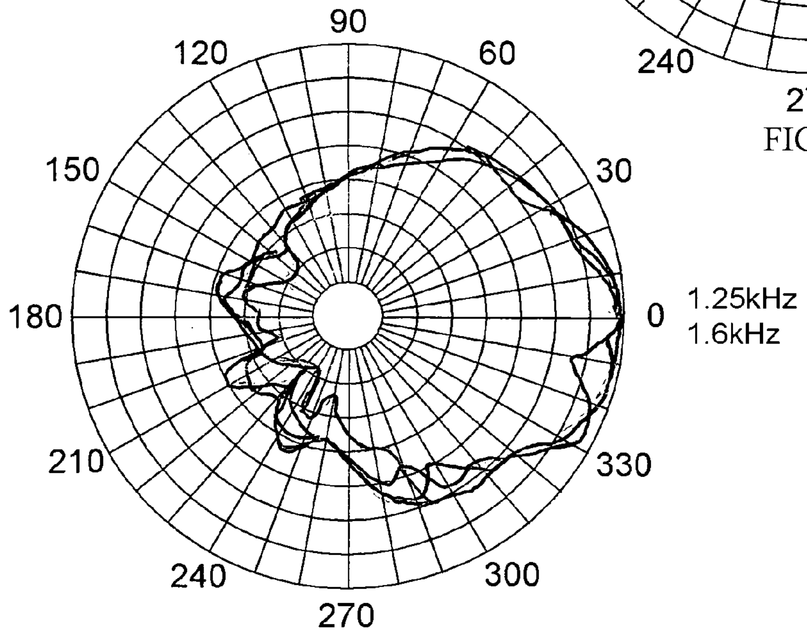
FIG. 12 is a graph showing polar vertical directivity of the mid-range array loudspeaker embodiment of FIG. 1 taken at frequencies ranging from 1.25 kHz–1.6 kHz.

FIG. 12 is a graph showing, polar vertical directivity of the mid-range array loudspeaker 100 of FIG. 1 taken at frequencies ranging from 1.25 kHz–1.6 kHz. The plots are taken at one-third-octave frequency ranges at 1.25 kHz and 1.6 kHz. With the 1.25 Hz plot being a one-third-octave higher that the 1 kHz plot of FIG. 11. The five-degree downward aiming of the mid-range loudspeaker drivers 104, 106, 108 and 110 of FIG. 1 is still evident.

Figure 13:
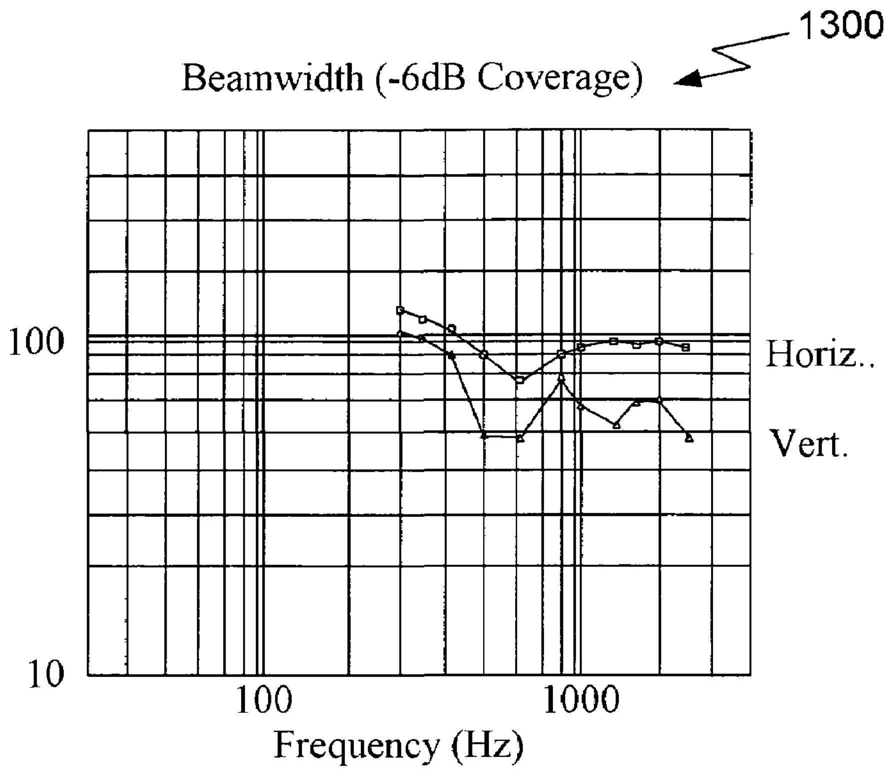
FIG. 13 is a graph with curves showing −6 dB horizontal and vertical beam width coverage versus frequency, based on data of FIGS. 7–13.

FIG. 13 is a graph 1300 with curves showing −6 dB horizontal and vertical beam width coverage versus frequency, based on the data of FIGS. 7–13. The graphs demonstrates the beam-width characteristics of the described mid-range array loudspeaker and demonstrates how the plurality of drivers and mid-range waveguide unit shape the vertical polar acoustical response to maintain substantially constant vertical beam-width within a predetermined frequency range of the mid-range array loudspeaker. Further, the substantially constant vertical beam-width is shown to be within a 50 degrees arc in FIGS. 7–13.

Figure 14:
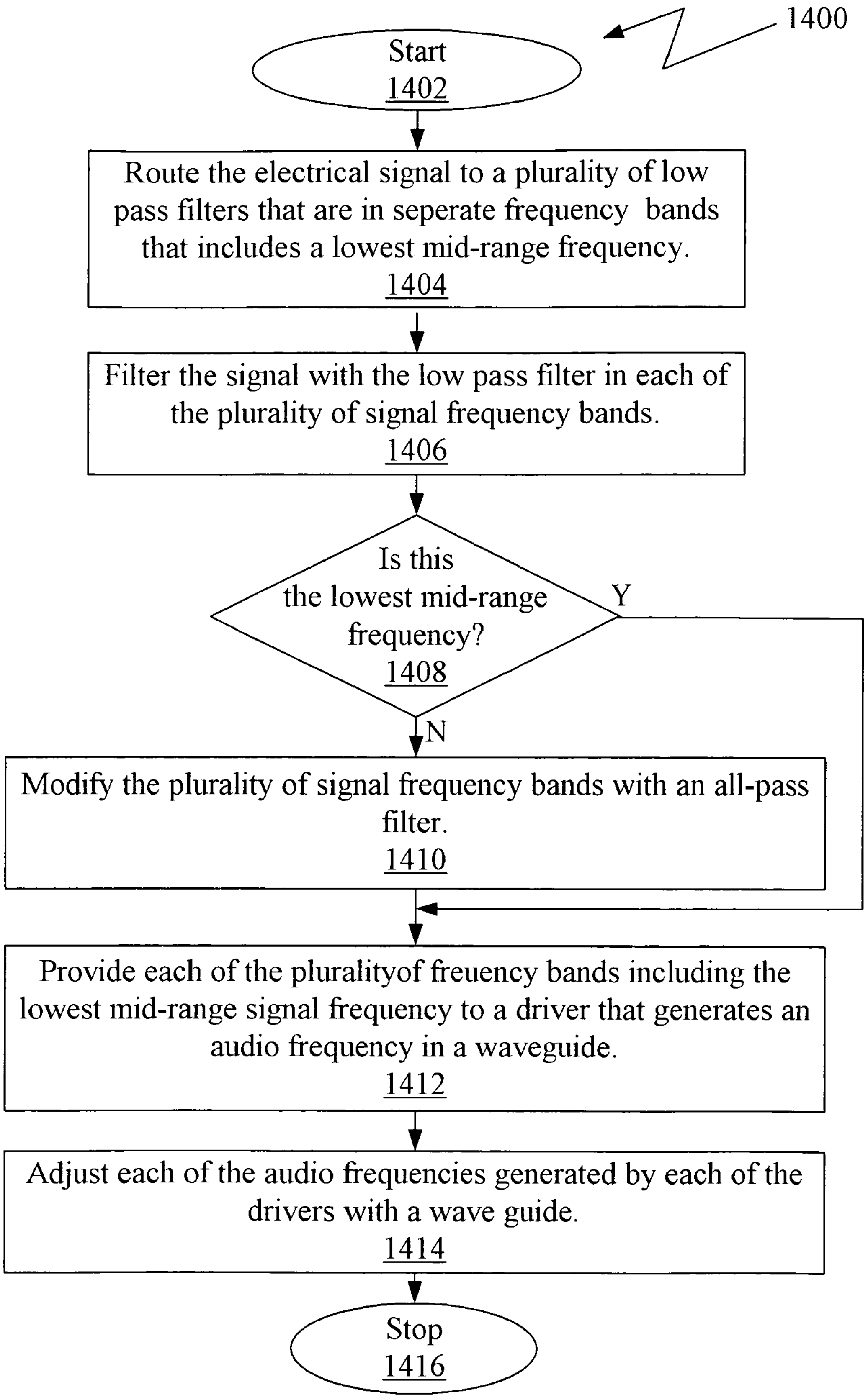
FIG. 14 is a flowchart of the steps for generating cinema sound with the mid-range loudspeaker module of FIG. 1 and drivers of FIG. 4.

FIG. 14 is a flowchart 1400 of the steps for generating cinema sound with the mid-range array loudspeaker of FIG. 1. The steps start 1402 with the electrical signal being routed to a plurality of low pass filters that are in separate frequency bands and include a lowest mid-range frequency 1404. The routing is accomplished by a common electrical node that has the electrical signal entering the electrical node and multiple paths out of the electrical node to the low pass filters. Each of the low pass filters is in a separate frequency band. In an alternate embodiment, more than one low pass filter may be combined within a frequency band.

The electrical signals exiting the electrical node are then filtered with the low pass filter in each of the plurality of frequency bands 1406. If the frequency band is not the lowest mid-range frequency 1408, then the plurality of signal frequency band is modified by an all-pass filter 1410. After the frequencies are modified by the all-pass filters, they are provided to a driver that generates an audio frequency in an associated waveguide 412. If the frequency band is the lowest mid-range frequency 1408, then the filtered electrical signal of the lowest mid-range frequency is provided to a diver that generates an audio frequency in an associated waveguide 1412. The audio frequencies are then adjusted by the waveguides 1414. The process is shown, as stopping in step 1416, but in practice the process may be continuous as long as an electrical signal is present.

While various embodiments of the invention have been described, it will be apparent to those of ordinary skill in the art that many more embodiments and implementations are possible that are within the scope of this invention.

What is claimed is:

1. A loudspeaker, comprising:

a waveguide unit;

a plurality of low pass filters where at least one of the low pass filters passes a signal of a frequency lower than the other filters; and a plurality of drivers positioned with the waveguide unit where at least one of the plurality of drivers is coupled to the at least one low pass filter that passes a signal of a frequency lower than the other filters and where at least one of the other plurality of drivers is coupled to a low pass filter and a frequency dependent phase delay where the frequency dependent phase delay is introduced by a delay line.

2. The loudspeaker of claim 1, where the loudspeaker has at least four drivers.

3. The loudspeaker of claim 1, where all of the plurality of drivers are coupled to a frequency dependent phase delay device, except for the driver coupled to the at least one low pass filter that passes a signal of a frequency lower than the other filters.

4. The loudspeaker of claim 1, where the plurality of drivers are tilted down at a predetermined angle.

5. The loudspeaker of claim 4, where the predetermined angle is greater than or approximately equal to five degrees.

6. The loudspeaker of claim 1, where the frequency dependent phase delay is introduced through the use of an all-pass filter.

7. The loudspeaker of claim 1, where the plurality of drivers and waveguide unit generate a frequency response from approximately 250 Hz to 1.5 kHz.

8. The loudspeaker of claim 1, where the plurality of drivers and waveguide unit shapes the vertical polar acoustical response to maintain substantially constant vertical beam-width within a predetermined frequency range.

9. The loudspeaker of claim 1, where the waveguide unit is designed to generally form a horn for each individual driver, such that each driver is internally separated from one another by a generally nosed shaped vane.

10. The loudspeaker of claim 1, where the plurality of drivers comprise an upper driver, an upper mid-driver, a lower mid-driver and a lower driver and where the waveguide unit separates the upper driver and upper mid-driver by an upper vane, the upper mid-driver and lower mid-driver by a mid-vane, and the lower mid-driver and lower driver by a lower vane.

11. The loudspeaker of claim 10, where the mid-vane extends farther outward toward the front of the loudspeaker than the upper and lower vanes.

12. The loudspeaker of claim 1, where the drivers are mid-frequency drivers.

13. A loudspeaker, comprising:

an electrical node in receipt of an electrical signal;

a plurality of filters connected to the electrical node that filters the electrical signal into a plurality of filtered electrical signals;

a frequency dependent phase delay device for introducing a frequency dependent phase delay into all of the filtered electrical signals, except for the filtered electrical signal of the lowest frequency; and a plurality of drivers positioned with a waveguide unit, where each of the plurality of drivers is tilted at a predetermined angle and receives a filtered electrical signal with a frequency dependent phase delay, except for the driver receiving the filtered electrical signal of the lowest frequency where the predetermined angle is not perpendicular to the face of the waveguide where the plurality of filters are low pass filters.

14. The loudspeaker of claim 13, where each of the drivers is tilted down by a predetermined angle.

15. The loudspeaker of claim 13, where each of the drivers is tilted down by at least five degrees.

16. The loudspeaker of claim 13, where the frequency dependent phase delay is caused by an all-pass filter.

17. The loudspeaker of claim 13, where the frequency dependent phase delay is caused by a delay line.

18. The loudspeaker of claim 13, where the waveguide unit is designed to generally form a horn for each individual driver, such that each driver is internally separated from one another by a generally nosed shaped vane.

19. The loudspeaker of claim 18, where the mid-vane extends farther outward toward the front of the loudspeaker than the upper and lower vanes.

20. The loudspeaker of claim 13, where the plurality of drivers comprise an upper driver, an upper mid-driver, a lower mid-driver and a lower driver and where the waveguide unit separates the upper driver and upper mid-driver by an upper vane, the upper mid-driver and lower mid-driver by a mid-vane, and the lower mid-driver and lower driver by a lower vane.

* * * * *